(12) United States Patent
Chen et al.

(10) Patent No.: US 11,908,851 B2
(45) Date of Patent: Feb. 20, 2024

(54) SEMICONDUCTOR DEVICE HAVING FIN STRUCTURE

(71) Applicant: TAIWAN SEMICONDUCTOR MANUFACTURING COMPANY LTD., Hsinchu (TW)

(72) Inventors: Shun-Li Chen, Tainan (TW); Chung-Te Lin, Tainan (TW); Hui-Zhong Zhuang, Kaohsiung (TW); Pin-Dai Sue, Tainan (TW); Jung-Chan Yang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 689 days.

(21) Appl. No.: 17/116,915

(22) Filed: Dec. 9, 2020

(65) Prior Publication Data

US 2021/0091066 A1    Mar. 25, 2021

Related U.S. Application Data

(62) Division of application No. 16/181,727, filed on Nov. 6, 2018, now Pat. No. 10,867,986.

(Continued)

(51) Int. Cl.
*H01L 29/66* (2006.01)
*H01L 27/02* (2006.01)
(Continued)

(52) U.S. Cl.
CPC .... *H01L 27/0207* (2013.01); *H01L 21/28525* (2013.01); *H01L 21/28568* (2013.01); *H01L 21/823821* (2013.01); *H01L 21/823871* (2013.01); *H01L 23/5221* (2013.01); *H01L 23/5286* (2013.01); *H01L 23/53209* (2013.01); *H01L 23/53271* (2013.01); *H01L 27/0924* (2013.01); *H01L 29/41791* (2013.01); *H01L 29/4238* (2013.01); *H01L 29/42372* (2013.01);
(Continued)

(58) Field of Classification Search
None
See application file for complete search history.

(56) References Cited

U.S. PATENT DOCUMENTS

2014/0339610 A1*  11/2014  Rashed ............... H01L 27/0886
                                                         257/288
2016/0293485 A1*  10/2016  Song ................. H01L 21/76829
(Continued)

*Primary Examiner* — Grant S Withers
(74) *Attorney, Agent, or Firm* — WPAT LAW; Anthony King

(57) ABSTRACT

A method for forming a semiconductor device includes: forming a fin structure protruding from a substrate of the semiconductor device; forming a first conductive rail on the substrate, wherein a side of the first conductive rail facing the fin structure has a first recess and a second recess; forming a first conductive line in a same layer as the first conductive rail by filling a first conductive material into the first recess, wherein the first conductive line extends across the fin structure and wraps a portion of the fin structure; and forming a second conductive line in the same layer as the first conductive rail by filling a second conductive material into the second recess, wherein the second conductive line extends across the fin structure and contacts another portion of the fin structure.

20 Claims, 13 Drawing Sheets

Related U.S. Application Data

(60) Provisional application No. 62/590,469, filed on Nov. 24, 2017.

(51) Int. Cl.
| | |
|---|---|
| *H01L 27/092* | (2006.01) |
| *H01L 23/522* | (2006.01) |
| *H01L 23/528* | (2006.01) |
| *H01L 21/285* | (2006.01) |
| *H01L 23/532* | (2006.01) |
| *H01L 21/8238* | (2006.01) |
| *H01L 29/423* | (2006.01) |
| *H01L 29/417* | (2006.01) |

(52) U.S. Cl.
CPC .. *H01L 29/42376* (2013.01); *H01L 29/66795* (2013.01)

(56) References Cited

U.S. PATENT DOCUMENTS

| | | | |
|---|---|---|---|
| 2016/0308008 A1* | 10/2016 | Yeo | H01L 29/66795 |
| 2016/0336183 A1* | 11/2016 | Yuan | H01L 27/0886 |
| 2018/0301559 A1* | 10/2018 | Liaw | H01L 29/66795 |
| 2019/0065658 A1* | 2/2019 | Peng | H01L 27/0207 |
| 2020/0105660 A1* | 4/2020 | Sio | H01L 29/41791 |

* cited by examiner

US 11,908,851 B2

SEMICONDUCTOR DEVICE HAVING FIN STRUCTURE

CROSS-REFERENCE TO RELATED APPLICATION

The present application is a divisional application of U.S. patent application Ser. No. 16/181,727 filed on Nov. 6, 2018, which claims the benefit of U.S. provisional application Ser. No. 62/590,469, filed on Nov. 24, 2017, each of which is incorporated herein by reference in its entirety.

BACKGROUND

In the rapidly advancing semiconductor manufacturing industry, complementary metal oxide semiconductor (CMOS) FinFET devices are increasingly used in many logic and other applications and are integrated into various different types of semiconductor devices. FinFET devices typically include semiconductor fins with high aspect ratios in which the channel and source/drain regions for the transistor are formed. A gate is formed over and along the sides of a portion of the semiconductor fins. The use of fins increases surface areas of the channel and source/drain regions for the same area. The increased surface area of the fins in a FinFET device results in faster, more reliable and better-controlled semiconductor transistor devices that consume less power. However, there are challenges to further reduce the size of the CMOS FinFET.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
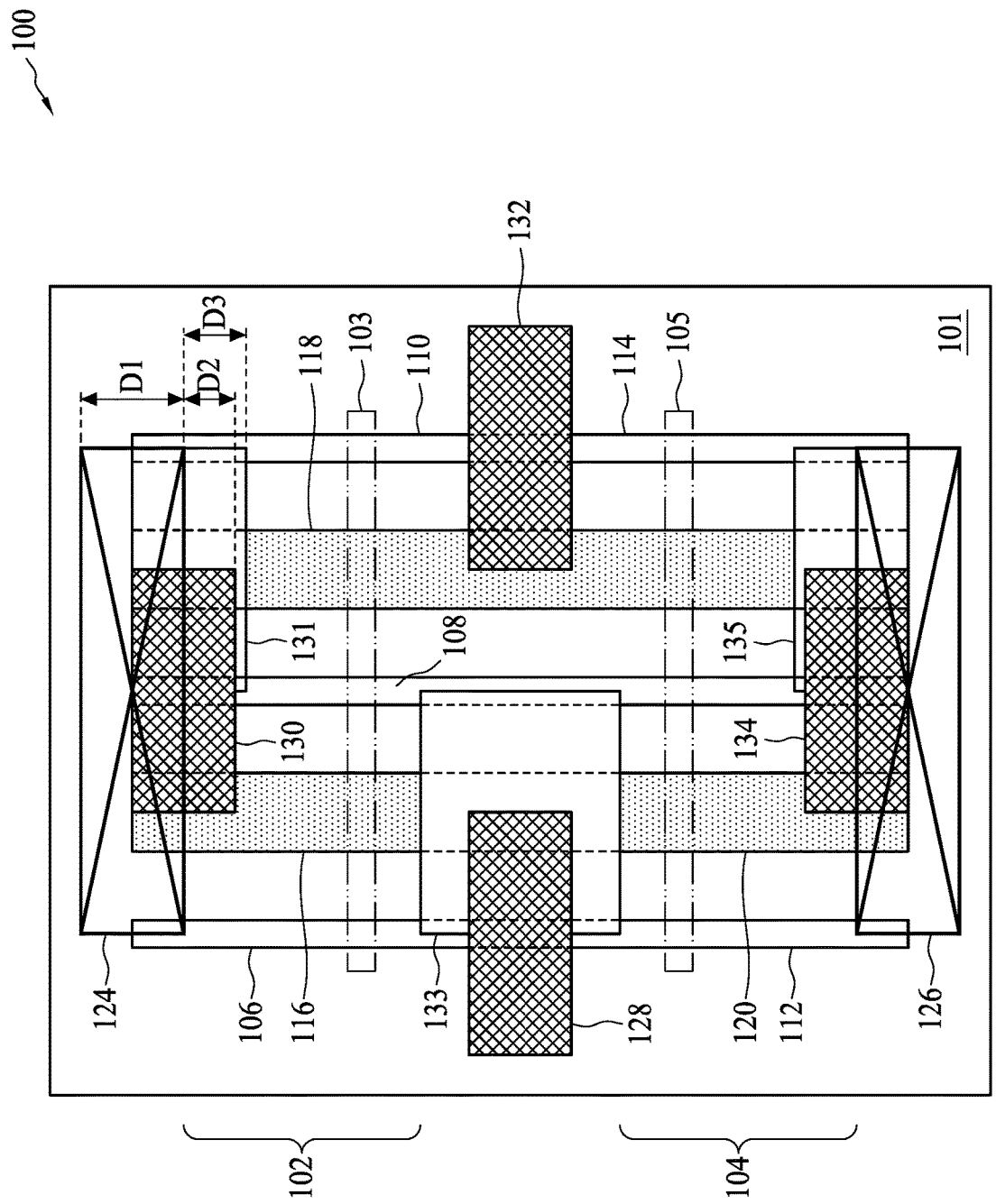
FIG. 1A is a top layout view of different components at different levels within a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 1B:
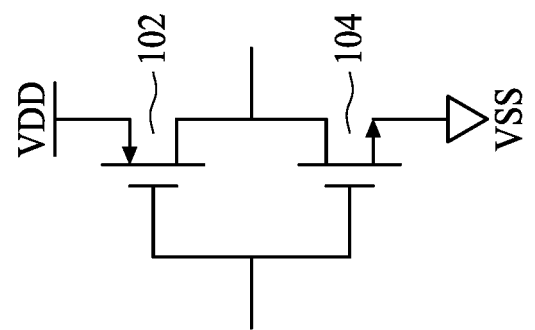
FIG. 1B is a diagram illustrating a circuit corresponding to the semiconductor device shown in FIG. 1A in accordance with some embodiments.

FIG. 1A is a top layout view of different components at different levels within a semiconductor device 100 in accordance with some embodiments. The semiconductor device 100 may be a standard cell of a complementary metal oxide semiconductor (CMOS) fin field-effect transistor (FinFET) device. For example, the semiconductor device 100 includes a P-channel transistor 102 and an N-channel transistor 104, located at the upper side and the bottom side of the semiconductor device 100 respectively. The P-channel transistor 102 and the N-channel transistor 104 can be used to implement a CMOS inverter as depicted in FIG. 1B. It is worth noting that while FIG. 1A shows one possible layout, aspects of the present disclosure can extend to any other layouts of a FinFET device or a CMOS FinFET device.

Referring to FIG. 1A, the semiconductor device 100 can include, but not limited to a plurality of fin structures 103 and 105 disposed in horizontal direction X, a plurality of conductive lines disposed in vertical direction Y, and a plurality of conductive rails 124 and 126 disposed in horizontal direction X. The conductive lines disposed in vertical direction Y can include, but is not limited to, a plurality of polysilicon lines 106, 108, 110, 112 and 114, and a plurality of metal lines 116, 118 and 120. Please note that each of the polysilicon lines 106, 108, 110, 112 and 114 can be implemented by other types of conductive lines without departing from the scope of the present disclosure. Similarly, each of the metal lines 116, 118 and 120 can be implemented by other types of conductive lines without departing from the scope of the present disclosure.

In the present embodiment, the fin structures 103 and 105, the polysilicon lines 106, 108, 110, 112 and 114, the metal lines 116, 118 and 120, and the conductive rails 124 and 126 are disposed on or above a semiconductor substrate, i.e. a substrate 101. The substrate 101 may include at least one of the following materials: silicon, silicon on insulator (SOI), silicon-on-insulator laminate (SSOI), silicon germanium-on-insulator laminate (S—SiGeOI), silicon germanium-on-insulator (SiGeOI), germanium-on-insulator (GeOI), and the like.

Each of the fin structures 103 and 105, arranged to be continuously disposed on the substrate 101, is a semiconductor fin protruded from the substrate 101 in order to form a source region, a drain region and a channel region of a transistor. For a P-channel transistor such as the P-channel transistor 102, a p-type impurity is implanted into predetermined regions of the fin to form the source and drain regions. For an N-channel transistor such as the N-channel transistor 104, an n-type impurity is implanted into predetermined regions of the fin to form the source and drain regions. According to some embodiments, the conductivity type impurity ions in the n-type and p-type source/drain regions are activated by applying activation annealing.

In the present embodiment, the polysilicon lines 106 and 112 are disposed on a left boundary of the CMOS FinFET device, i.e. the semiconductor device 100, and the polysilicon lines 110 and 114 are disposed on a right boundary of the CMOS FinFET device. It should be noted that the CMOS FinFET device may abut with another CMOS FinFET device on the right/left boundary. For example, the polysilicon line 106/112 can serve as a bridge polysilicon line for a CMOS FinFET device near the left boundary. As another example, the polysilicon line 110/114 can serve as a bridge polysilicon line for a CMOS FinFET device near the right boundary. In addition, the polysilicon line 106 is separated from the polysilicon line 112 because a poly-cut symbol 128, or a poly-cut layer, is shown therebetween. A poly-cut symbol/layer is a symbol for cutting/removing a portion of a polysilicon line covered the poly-cut symbol. Similarly, the polysilicon line 110 is separated from the polysilicon line 114 because a poly-cut symbol 132 is shown therebetween.

The metal lines 116 and 120 are formed on a same side of the polysilicon line 108, but separated from each other because a metal-cut symbol 133, or a metal-cut layer, is shown therebetween. A metal-cut symbol/layer is a symbol for cutting/removing a portion of a metal line covered the metal-cut symbol. The metal line 118 is situated between the polysilicon lines 108 and 110.

The conductive rail 124 is disposed on an upper boundary of the CMOS FinFET device, and the conductive rail 126 is disposed on a lower boundary of the CMOS FinFET device. It should be noted that the CMOS FinFET device may abut with another CMOS FinFET device on the upper/lower boundary. The conductive rail 124 is separated or disconnected from the polysilicon line 108 due to a poly-cut symbol 130. Also, conductive rail 124 is separated or disconnected from the metal line 118 due to a metal-cut symbol 131. Similarly, the conductive rail 126 is disconnected from the polysilicon line 108 due to a poly-cut symbol 134, and disconnected from the metal line 108 due to a poly-cut symbol 135. Each of the conductive rails 124 and 126 may include materials such as tungsten, aluminum, copper, titanium, tantulum, titanium nitride, tantalum nitride, nickel silicide, cobalt silicide, other metallic materials, other proper conductive materials, and/or combinations thereof.

In the P-channel transistor 102, the polysilicon lines 106, 108 and 110 are arranged to wrap three different portions of the fin structure 103 respectively. In other words, the polysilicon lines 106, 108 and 110 are arranged to partially surround three different portions of the fin structure 103 respectively. A dielectric layer may be formed between a polysilicon line, i.e. one of the polysilicon lines 106, 108 and 110, and a corresponding portion wrapped by the polysilicon line. The metal lines 116 and 118, also referred to as metal contacts, are arranged to be attached on two different portions of the fin structure 103 respectively. By way of example but not limitation, the polysilicon line 108 is arranged to wrap a gate region of the fin structure 103. The metal line 116 is arranged to be attached on one of a source region and a drain region of the fin structure 103, and the metal line 118 is arranged to be attached on the other of the source region and the drain region of the fin structure 103. The polysilicon line 106 is arranged to wrap a predetermined region of the fin structure 103 different from the gate region, the source region and the drain region. The polysilicon line 110 is arranged to wrap another predetermined region of the fin structure 103 different from the gate region, the source region and the drain region.

The conductive rail 124 is disposed in a same layer as the polysilicon lines 106, 108 and 110 and the metal lines 116 and 118. The conductive rail 124 is arranged to be attached on one end of the polysilicon line 106 and one end of the metal line 116 for electrically connecting the polysilicon line 106 and the metal line 116. As a result, in some embodiments where the metal line 116 is electrically connected to a reference voltage such as a supply voltage VDD shown in FIG. 1B, the polysilicon line 106 can be electrically connected to the reference voltage through the conductive rail 124 and the metal line 116, each of which is disposed in the same layer as the polysilicon line 106. In the present embodiment, the conductive rail 124 can also be arranged to be attached on one end of the polysilicon line 110, such that the polysilicon line 110 can be electrically connected to the polysilicon line 106 and the metal line 116 through the conductive rail 124.

In the N-channel transistor 104, the polysilicon lines 112, 108 and 114 are arranged to wrap three different portions of the fin structure 105 respectively. A dielectric layer may be formed between a polysilicon line, i.e. one of the polysilicon lines 112, 108 and 114, and a corresponding respective portion wrapped by the polysilicon line. The metal lines 120 and 118, also referred to as metal contacts, are arranged to be attached on two different portions of the fin structure 105 respectively. By way of example but not limitation, the polysilicon line 108 is arranged to wrap a gate region of the fin structure 105. The metal line 118 is arranged to be attached on one of a source region and a drain region of the fin structure 105, and the metal line 120 is arranged to be attached on the other of the source region and the drain region of the fin structure 105. The polysilicon line 112 is arranged to wrap a predetermined region of the fin structure 105 different from the gate region, the source region and the drain region. The polysilicon line 114 is arranged to wrap another predetermined region of the fin structure 105 different from the gate region, the source region and the drain region.

The conductive rail 126 is disposed in a same layer as the polysilicon lines 112, 108 and 114 and the metal lines 120 and 118. Also, the metal rail 126 is arranged to be attached on one end of the polysilicon line 112, one end of the metal line 120, and one end of the polysilicon line 114. As a result, in some embodiments where the metal line 120 is electrically connected to a reference voltage, such as a ground voltage or a supply voltage VSS shown in FIG. 1B, the polysilicon line 112/114 can be electrically connected to the reference voltage through the conductive rail 126 and the metal line 120. The conductive rail 126 and the metal line 120 are disposed in the same layer as the polysilicon line 112/114.

Figure 1C:
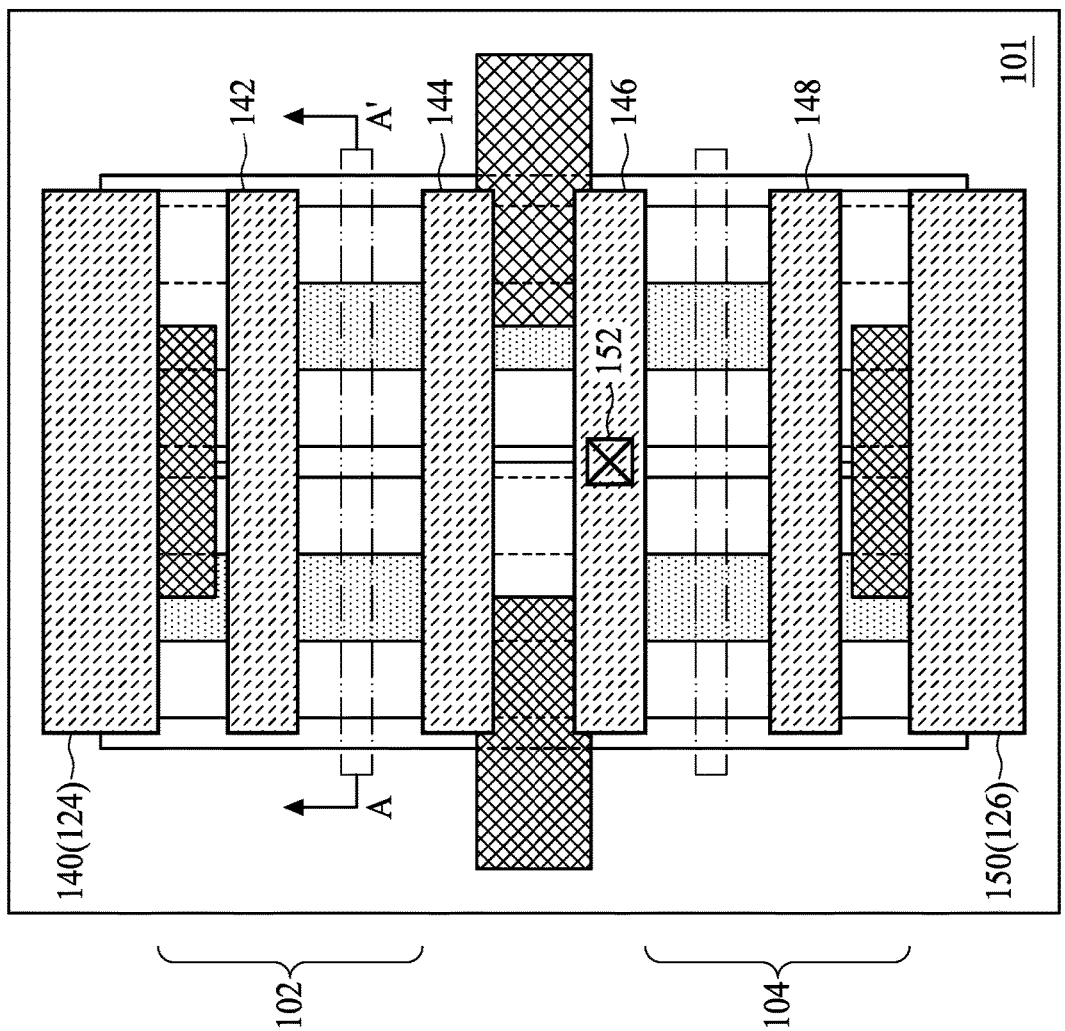
FIG. 1C is a top layout view of the semiconductor device shown in FIG. 1A after formation of a predetermined metal layer in accordance with some embodiments.

FIG. 1C is a top layout view of the semiconductor device 100 shown in FIG. 1A after formation of a predetermined metal layer in accordance with some embodiments. The predetermined metal layer, such as the metal layer MO of the semiconductor device 100, may include a plurality of metal lines 140, 142, 144, 146, 148 and 150. The metal lines 142, 144 and 148 are metal routings passing through the P-channel transistor 102 and the N-channel transistor 104. According to design requirements, the metal lines 142 and 144 may or may not be electrically connected to the P-channel transistor 102. Similarly, according to design requirements, the metal line 148 may or may not be electrically connected to the N-channel transistor 104. Additionally, in the present embodiment, a conductive via 152 is formed between the polysilicon line 108 and the metal line 146. As a result, the polysilicon line 108 is electrically connected to the metal line 146 through the conductive via 152.

Referring to FIG. 1C and also to FIG. 1A, the metal line 140, disposed above and electrically connected to the conductive rail 124, is coupled to a reference voltage such as the supply voltage VDD shown in FIG. 1B. As a result, the metal line 140 can serve as a power supply line coupled to the reference voltage. The conductive rail 124 is coupled to the reference voltage through the power supply line, i.e. the metal line 140. In the present embodiment, a conductive structure, such as a conductive rail or a conductive via structure, can be formed between the conductive rail 124 and the metal line 140 to provide electrical connection. By way of example but not limitation, a conductive rail (not shown in FIG. 1C), located in a same layer as the conductive via 152, can be formed on the conductive rail 124 to provide electrical connection between the conductive rail 124 and the metal line 140. The width of this conductive rail can be equal to or substantially equal to the width D1 of the conductive rail 124.

The metal line 150, disposed above and electrically connected to the conductive rail 126, is coupled to a reference voltage such as the supply voltage VSS shown in FIG. 1B. As a result, the metal line 150 can serve as a power supply line coupled to the reference voltage. The conductive rail 126 is coupled to the reference voltage through the power supply line, i.e. the metal line 150. In the present embodiment, a conductive structure, such as a conductive rail or a conductive via structure, can be formed between the conductive rail 126 and the metal line 150 to provide electrical connection. By way of example but not limitation, a conductive rail (not shown in FIG. 1C), located in a same layer as the conductive via 152, can be formed on the conductive rail 126 to provide electrical connection between the conductive rail 126 and the metal line 150. The width of this conductive rail can be equal to or substantially equal to that of the conductive rail 126.

It is worth noting that as the conductive rails 124 and 126 are respectively buried by the metal lines 140 and 150, each of which can serve as a power supply line, the conductive rails 124 and 126 can be referred to as buried power rail structures. The polysilicon line 106 can be electrically connected to the metal line 140, e.g. a power supply line, through a corresponding buried power rail structure which is formed in a same layer as the polysilicon line 106 and the metal line 116. Similarly, the polysilicon line 112 can be electrically connected to the metal line 150, e.g. a power supply line, through a corresponding buried power rail structure which is formed in a same layer as the polysilicon line 112 and the metal line 120.

With the use of a buried power rail structure, a polysilicon line can be electrically connected to a corresponding power supply line without introducing a conductive via landing issue which occurs in an existing layout structure. For example, the existing layout structure will dispose a conductive via between the polysilicon line 106 and the metal line 140 to provide electrical connection. However, when the height H of the semiconductor device 100 is reduced due to device miniaturization, the width of the metal line 140 is reduced accordingly. The lower part of the conductive via will be not enclosed or contacted by the metal line 140 due to process limitation, which is known as a landing issue of the conductive via. As the metal line 140 fails to fully enclose the conductive via, the connection between the metal line 140 and the conductive via has a low reliability.

In contrast to the existing layout structure, a semiconductor cell structure utilizing buried power rails can provide reliable electrical connection in miniaturized devices without introducing a conductive via landing issue. For example, referring to FIG. 1A again, the width D1 may be proportional to the height H of the semiconductor device 100. According to some embodiments, the width D1 may fall within a range of 16 to 36 nanometer (nm). When the height H is approximately, for example, 156 nm, the width D1 of the conductive rail 124 can be reduced to approximately 26 nm while maintaining reliable electrical connection between the polysilicon line 106 and the metal line 140. Additionally or alternatively, in some embodiments, the width of a conductive rail, formed between the conductive rail 124 and the metal line 140 shown in FIG. 1C, can be equal to or substantially equal to the width D1. According to some embodiments, the minimum space/distance D2 between the conductive rail 124 and the end of the polysilicon line 108 may fall within a range of 10 to 20 nm. For example, the distance D2 may be approximately 13 nm. According to some embodiments, the minimum space/distance D3 between the conductive rail 124 and the one end of the metal line 118 may fall within a range of 10 to 20 nm. For example, the distance D3 may be approximately 15 nm. According to some embodiments, the distance D3 is greater than the distance D2.

For brevity, the following description mainly focus on the upper side, i.e. the P-channel transistor 102, of the semiconductor device 100. Those skilled in the art will recognize that the following description can be applied to the lower side, i.e. the N-channel transistor 104, of the semiconductor device 100. It is worth noting that although the buried power rail structure is described with reference to a CMOS inverter, those skilled in the art will recognize that the buried power rail structure is applicable to other types of semiconductor devices.

Figure 2:
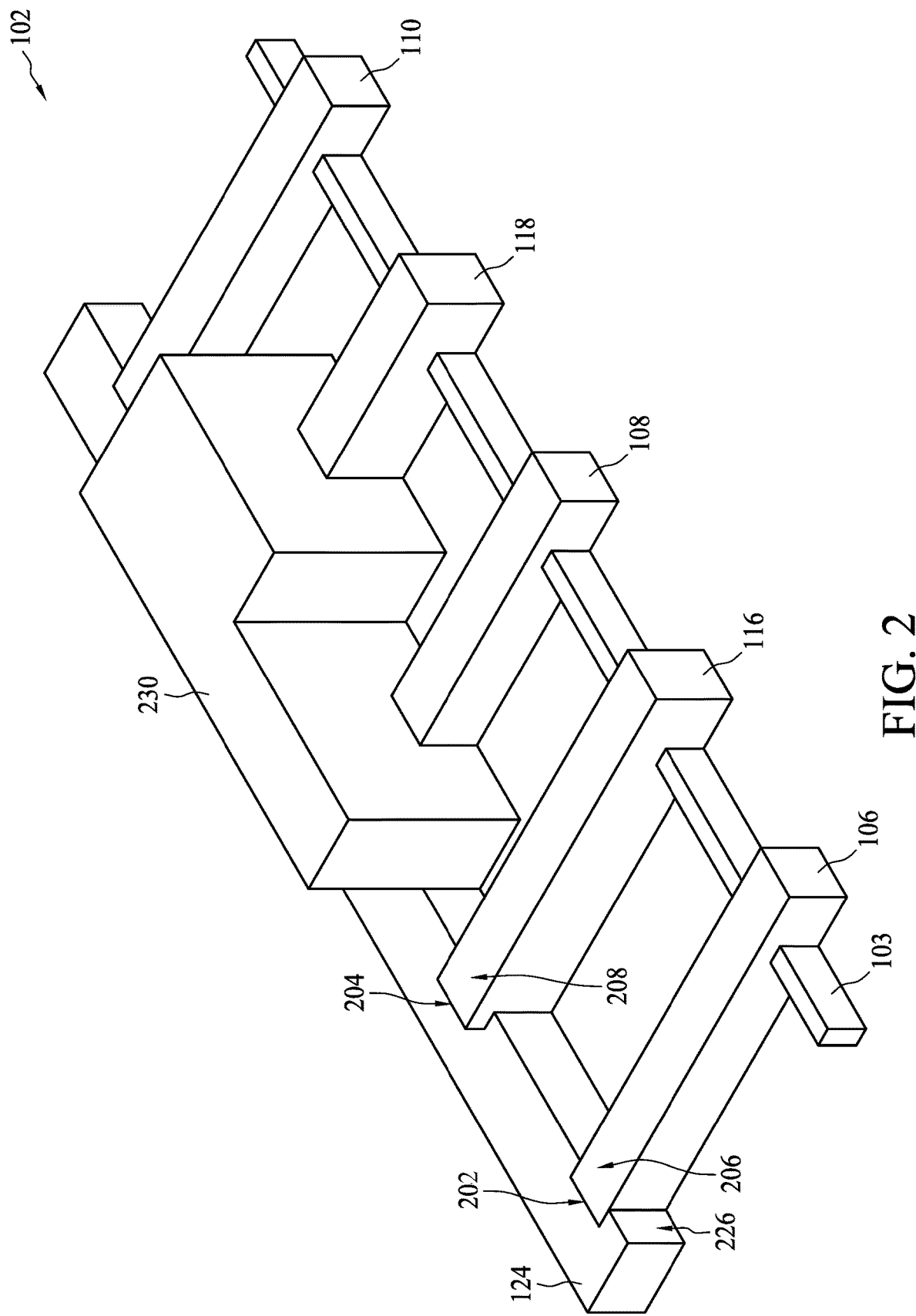
FIG. 2 is a diagram illustrating a perspective view of a portion of the semiconductor device shown in FIG. 1A in accordance with some embodiments.

FIG. 2 is a diagram illustrating a perspective view of a portion of the semiconductor device 100 shown in FIG. 1A in accordance with some embodiments. The structure shown in FIG. 2 can represent an embodiment of a portion of the P-channel transistor 102 shown in FIG. 1A. In the present embodiment, the polysilicon line 108 is separated from the conductive rail 124 due to an isolation region 230, which can be defined by the poly-cut symbol 130 and the metal-cut symbol 131 shown in FIG. 1A. As a result, the polysilicon line 108 is disposed in the same layer as the conductive rail 124 while disconnected from the conductive rail 124. Similarly, the metal line 118 is disposed in the same layer as the conductive rail 124 while disconnected from the conductive rail 124.

In contrast, one end 206 of the polysilicon line 106, one end 208 of the metal line 116, and one end 210 of the polysilicon line 110 can be contacted with a lateral surface 226 of the conductive rail 124, which is formed in a same layer as the polysilicon line 106, the metal line 116 and the polysilicon line 110. By way of example but not limitation, the conductive rail 124 extends in a direction parallel to, or substantially parallel to, the fin structure 103. As a result, the conductive rail 124 can be laterally contacted by the polysilicon line 106, the metal line 116 and the polysilicon line 110.

Figure 3:
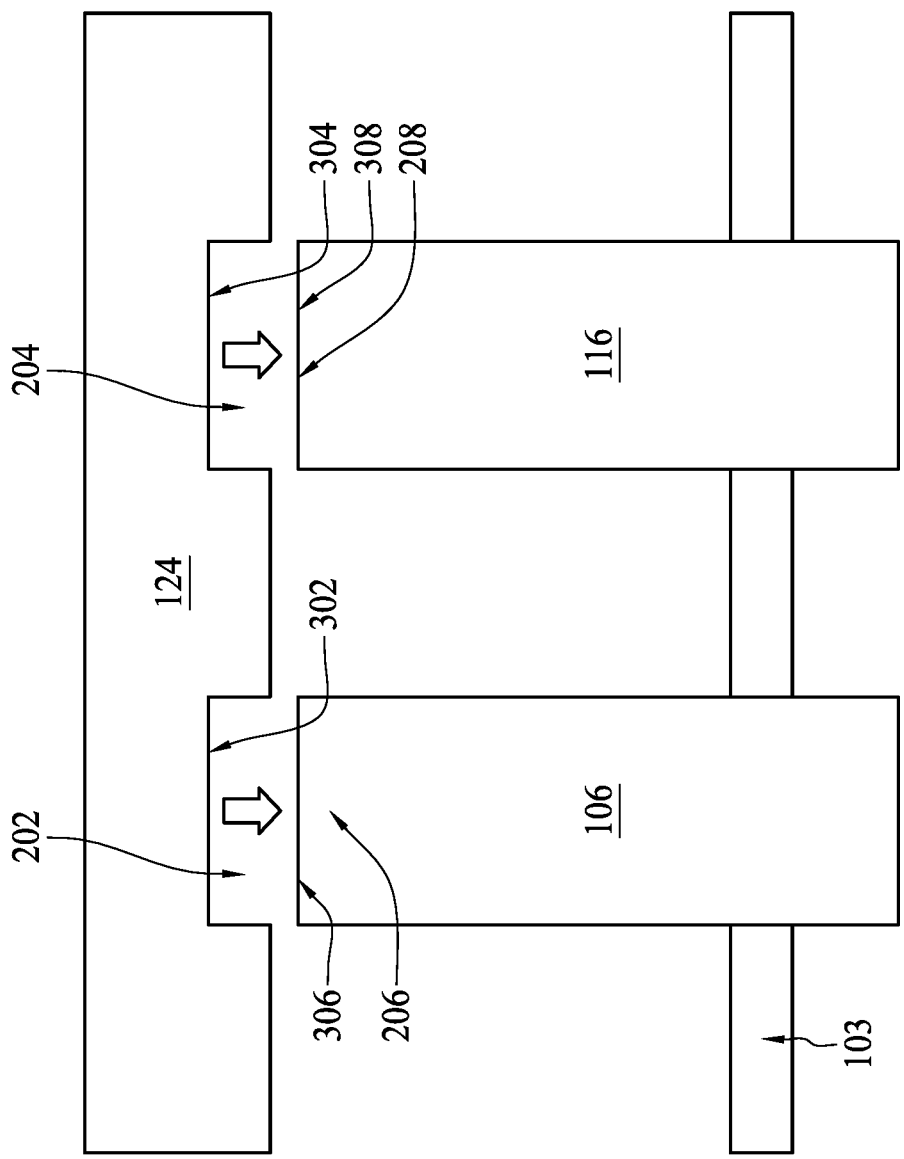
FIG. 3 is a schematic top view of the polysilicon line, the metal line, the conductive rail and the fin structures shown in FIG. 2 in accordance with some embodiments.

FIG. 3 is a schematic top view of the polysilicon line 106, the metal line 116, the conductive rail 124 and the fin structures 103 shown in FIG. 2 in accordance with some embodiments. Referring to FIG. 3 and also to FIG. 2, the conductive rail 124 is arranged to have a first recess 202 and a second recess 204. The end 206 of the polysilicon line 106 and the end 208 of the metal line 116 are disposed in the first recess 202 and the second recess 204, respectively. In the present embodiment, the conductive rail 124 can be, but is not limited to, directly connected to each of the polysilicon line 106 and the metal line 116. For example, the end 206 of the polysilicon line 106 has a first side surface 306, and the end 208 of the metal line 116 has a second side surface 308. The first recess 202 has a third side surface 302 arranged to be contacted with the first side surface 306. Also, the second recess 204 has a fourth side surface 304 arranged to be contacted with the second side surface 308.

Figure 4:
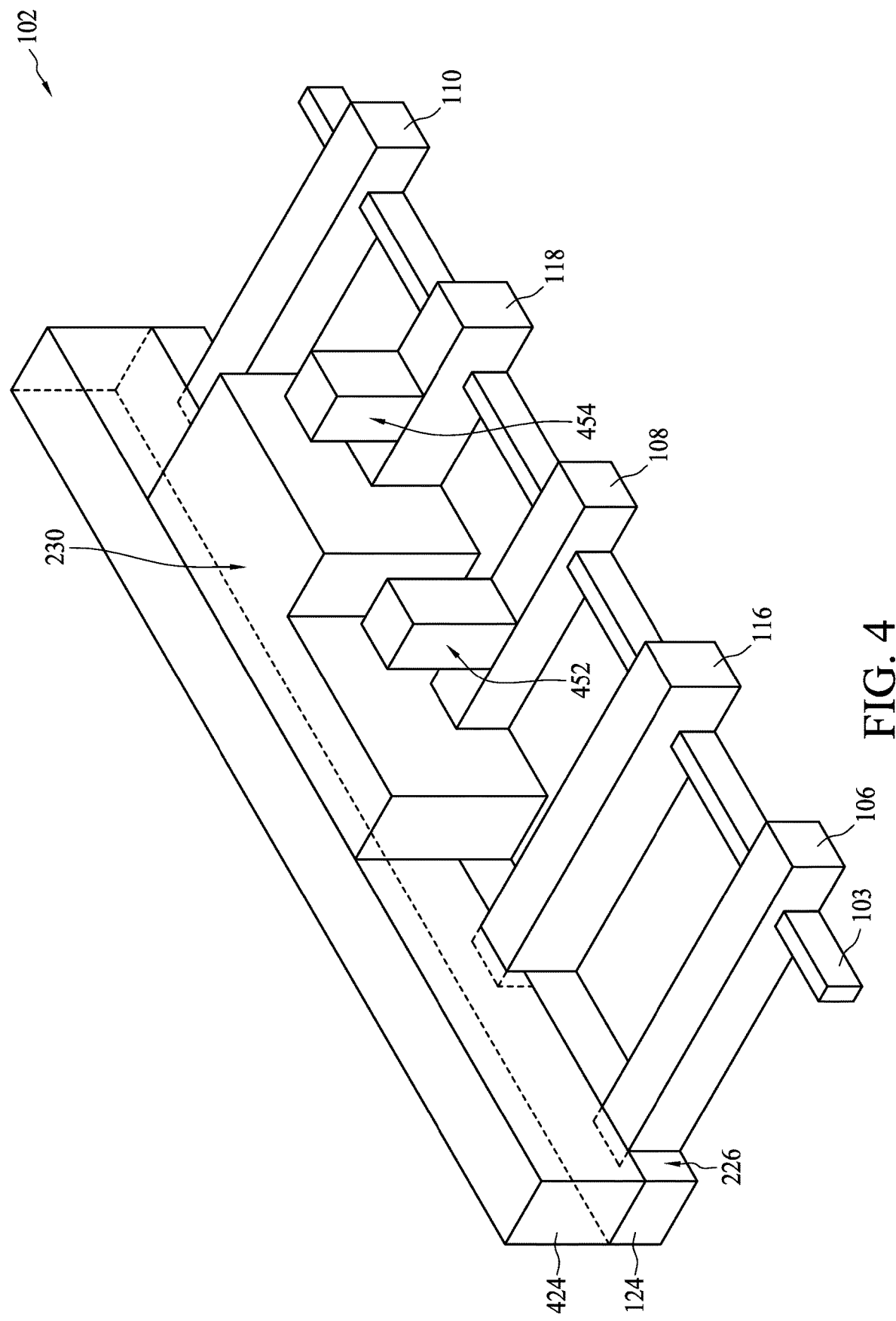
FIG. 4 is a diagram illustrating a perspective view of a portion of the semiconductor device shown in FIG. 1C in accordance with some embodiments.

FIG. 4 is a diagram illustrating a perspective view of a portion of the semiconductor device 100 shown in FIG. 1C in accordance with some embodiments. The structure shown in FIG. 4 can represent an embodiment of a portion of the P-channel transistor 102 shown in FIG. 1C. The structure shown in FIG. 4 is similar/identical to the structure shown in FIG. 2 except that a conductive rail 424 is formed on the conductive rail 124. The conductive rail 424 can be an embodiment of a conductive structure formed between the conductive rail 124 and the metal line 140 shown in FIG. 1C. As a result, the conductive rail 424 is electrically connected to a reference voltage through the metal line 140. In the present embodiment, the conductive rail 424 may extend in parallel to, or substantially in parallel to, the fin structure 103.

Also, a conductive via 452 and a conductive via 454 are formed on the polysilicon line 108 and the metal line 118, respectively, to provide electrical connection. The conductive rail 424, the conductive via 452 and the conductive via 454 can be disposed in a same layer, such as a layer below the aforementioned predetermined metal layer which includes the metal lines 140 and 142 shown in FIG. 1C. The metal lines 140 and 142 shown in FIG. 1C are not illustrated in FIG. 4 for the sake of brevity.

Figure 5:
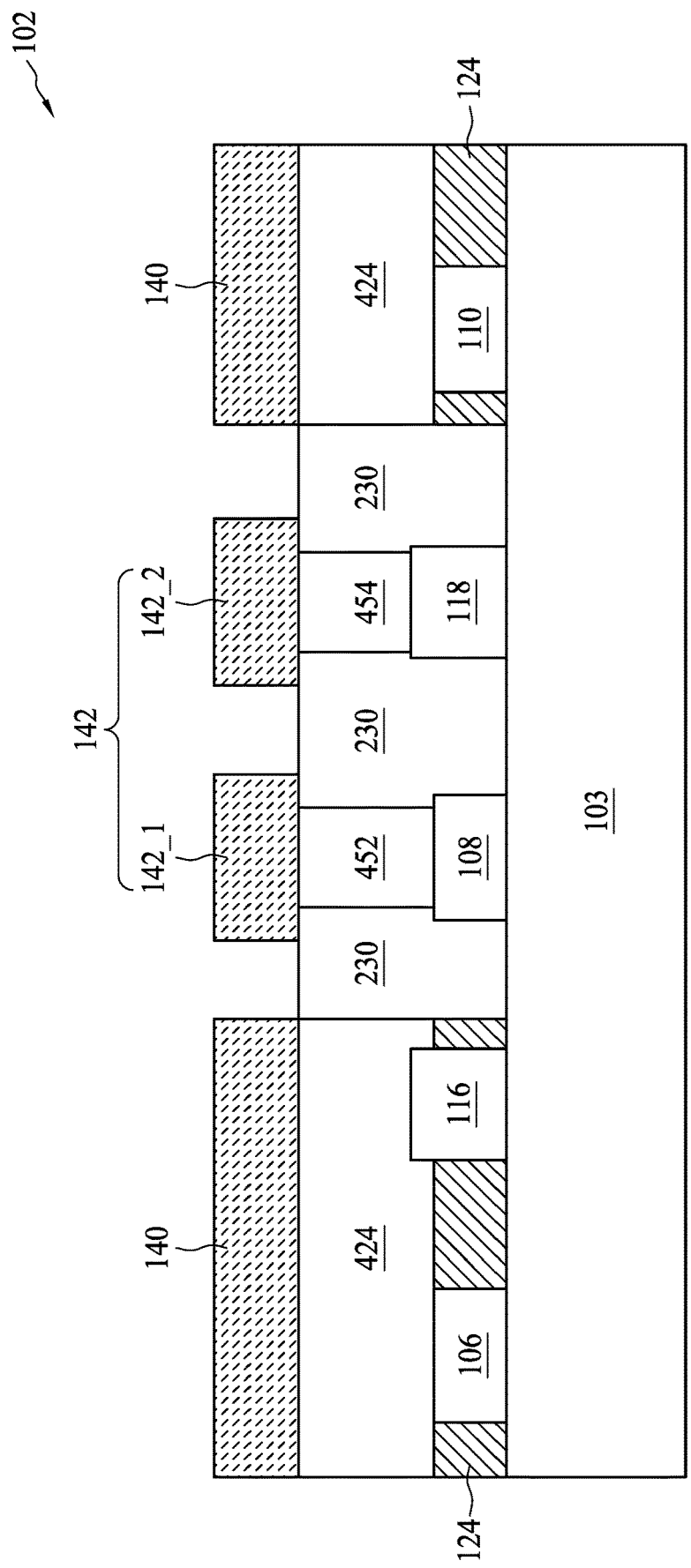
FIG. 5 is a sectional view taken along line A-A' of FIG. 1C in accordance with some embodiments.

FIG. 5 is a sectional view taken along line A-A' of FIG. 1C in accordance with some embodiments. In the embodiment shown in FIG. 5, the P-channel transistor 102 can employ the structure shown in FIG. 4. As a result, a side of the conductive rail 124, which faces the fin structure 103, is contacted with the polysilicon line 106, the metal line 116 and the polysilicon line 110, while disconnected from the polysilicon line 108 and the metal line 118 due to the isolation region 230.

The metal lines 140 and 142 shown in FIG. 1C are also shown in FIG. 5 for illustrative purposes. In the present embodiment, the metal line 142 includes a first portion 142_1 and a second portion 1422 separated from each other. The first portion 142_1 is formed on the conductive via 452. The second portion 142_2 is formed on the conductive via 454. The metal line 140, formed on the conductive rail 424, can serve as a power supply line coupled to a supply voltage. The polysilicon line 106/110 is coupled to the power supply line through the conductive rails 124 and 424 rather than a conductive via. As a result, the size of a semiconductor device utilizing a buried power rail structure can be reduced without introducing a conductive via landing issue.

Figure 6:
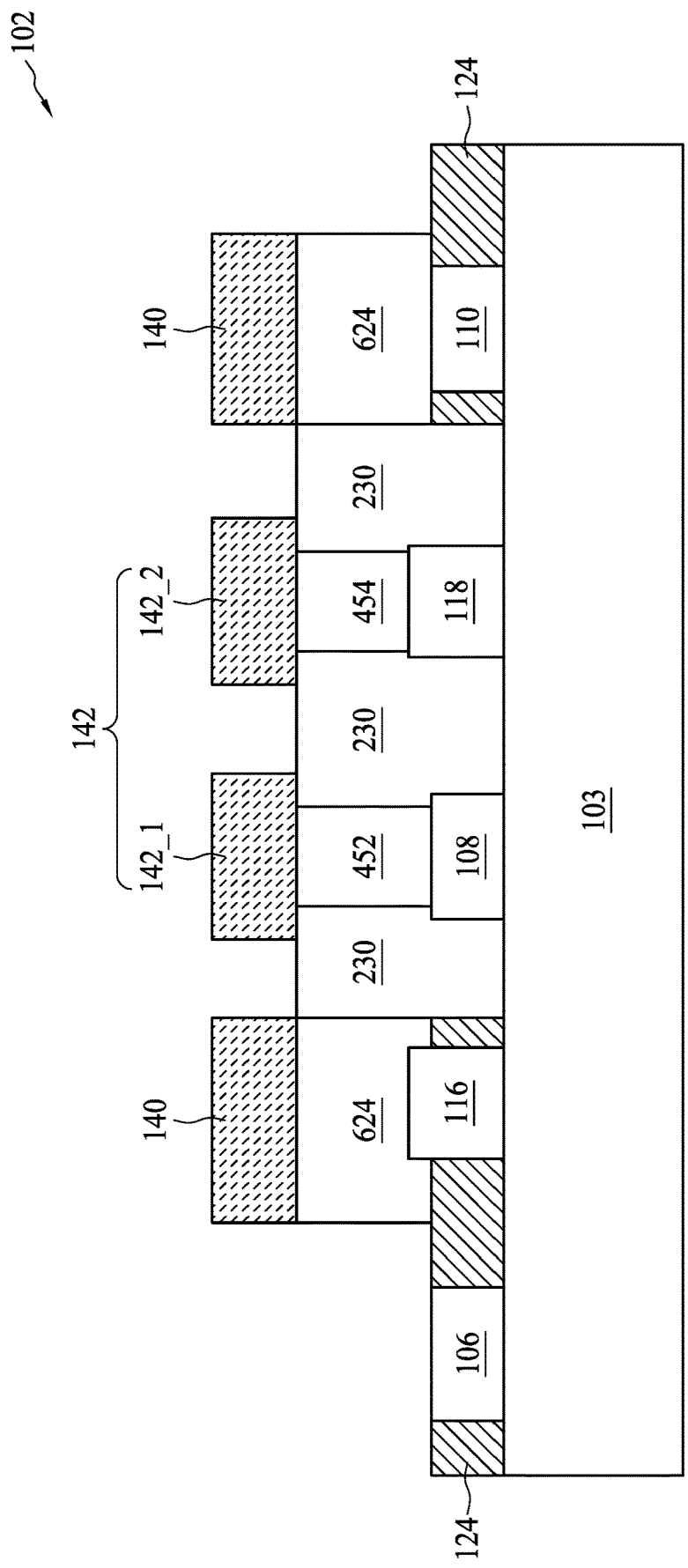
FIG. 6 is a diagram illustrating a perspective view of a portion of the semiconductor device shown in FIG. 1C in accordance with some embodiments.

In some embodiments, the length of the conductive rail 424 can be shorter than that of the conductive rail 124. FIG. 6 is a diagram illustrating a perspective view of a portion of the semiconductor device 100 shown in FIG. 1C in accordance with some embodiments. The structure shown in FIG. 6 can represent an embodiment of a portion of the P-channel transistor 102 shown in FIG. 1C. The structure shown in FIG. 6 is similar/identical to the structure shown in FIG. 5 except that a conductive rail 624 has a length shorter than that of the conductive rail 124. Also, a pattern of the metal line 140, formed on the conductive rail 624, can vary accordingly.

Figure 7A:
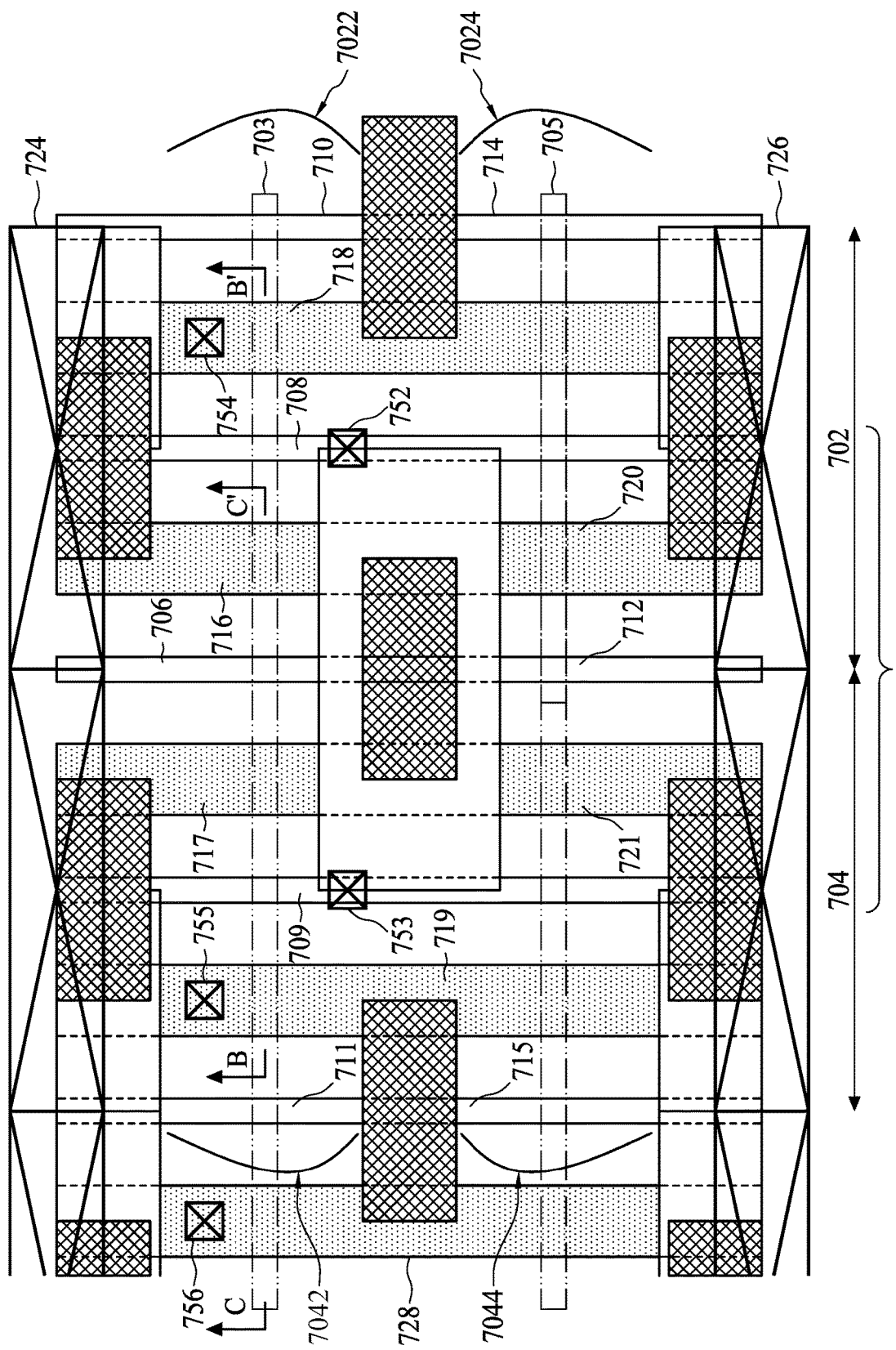
FIG. 7A is a top layout view of different components at different levels within a semiconductor device in accordance with some embodiments.
Figure 7B:
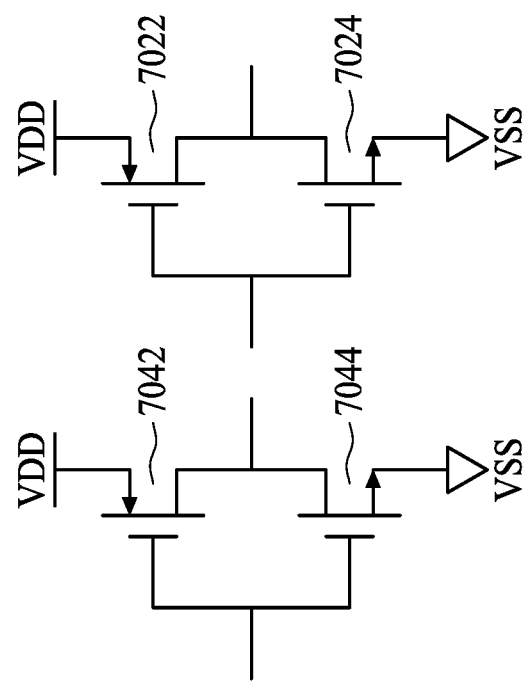
FIG. 7B is a diagram illustrating circuits corresponding to the CMOS FinFET devices shown in FIG. 1A in accordance with some embodiments.

In some embodiments, a bridge polysilicon line situated between two adjacent FinFET devices can be electrically connected to a power supply line through a buried power rail structure. These two FinFET devices can be coupled to a same supply voltage through the shared buried power rail structure. FIG. 7A is a top layout view different components at different levels within a semiconductor device 700 in accordance with some embodiments. The semiconductor device 700 comprises at least two CMOS FinFET devices 702 and 704. The structure of the CMOS FinFET device 702 is similar to that of the CMOS FinFET device, i.e. the semiconductor device 100, shown in FIG. 1A except that the CMOS FinFET device 702 further includes conductive vias 752 and 754, which are formed on a polysilicon line 708 and a metal line 718 respectively. The CMOS FinFET device 704 abuts the CMOS FinFET device 702 at a boundary. According to some embodiments, the CMOS FinFET device 704 and the CMOS FinFET device 702 are mirror symmetry with respect to the boundary. The CMOS FinFET device 704 may include conductive vias 753 and 755, which are formed on a polysilicon line 709 and a metal line 719 respectively. Each of the CMOS FinFET devices 702 and 704 can be used to implement a CMOS inverter as depicted in FIG. 7B.

In the present embodiment, the CMOS FinFET device 702 and the CMOS FinFET device 704 can share a same fin structure. A first fin structure 703 is arranged to pass through a first P-channel transistor 7022 in the CMOS FinFET device 702 and a second P-channel transistor 7042 in the CMOS FinFET device 704. A second fin structure 705 is arranged to pass through a first N-channel transistor 7024 in the CMOS FinFET device 702 and a second N-channel transistor 7044 in the CMOS FinFET device 704. As each of the CMOS FinFET devices 702 and 704 is similar to the semiconductor device 100 shown in FIG. 1A, similar description is not repeated here for brevity.

A first conductive rail 724 is disposed at the top side of the CMOS FinFET devices 702 and 704, and a second conductive rail 726 is disposed at the bottom side of the CMOS FinFET devices 702 and 704. The first conductive rail 724 is a continuous conductive rail for connecting a polysilicon line 706, a metal line 716, a polysilicon line 710 and a metal line 717, wherein the polysilicon line 706 can serve as a bridge polysilicon line. The first conductive rail 724 is electrically connected to the supply voltage VDD shown in FIG. 7B. The second conductive rail 726 is a continuous conductive rail for connecting a polysilicon line 712, a metal line 720, a polysilicon line 714 and a metal line 712, wherein the polysilicon line 712 can serve as a bridge polysilicon line. The second conductive rail 726 is electrically connected to the supply voltage VSS shown in FIG. 7B or a ground voltage.

The semiconductor device 700 further comprises a metal line 728, a polysilicon line 711 and a polysilicon line 715. A conductive via 756 is formed on the metal line 728. Each of the polysilicon lines 711 and 715, disposed on a left boundary of the CMOS FinFET device 704, can serve as a bridge polysilicon line.

In the present embodiment, the metal lines 718, 719 and 728 are attached on different drain regions of the fin structure 703, respectively. The metal lines 718, 719 and 728 are also attached on different drain regions of the fin structure 705, respectively. As a result, the metal line 718 is electrically connected to respective drains of the P-channel transistor 7022 and the N-channel transistor 7024. The metal line 719 is electrically connected to respective drains of the P-channel transistor 7042 and the N-channel transistor 7044. In addition, the polysilicon lines 708 and 709 are arranged to wrap different gate regions of the fin structure 703 and different gate regions of the fin structure 705. The polysilicon line 708 is electrically connected to respective gates of the P-channel transistor 7022 and the N-channel transistor 7024. The polysilicon line 709 is electrically connected to respective gates of the P-channel transistor 7042 and the N-channel transistor 7044. Furthermore, the metal lines 716 and 717 are attached on different source regions of the fin structure 703, respectively. The metal lines 720 and 721 are attached on different source regions of the fin structure 705, respectively. As a result, the metal lines 716 and 720 are electrically connected to respective sources of the P-channel transistor 7022 and the N-channel transistor 7024. The metal lines 717 and 721 are electrically connected to respective sources of the P-channel transistor 7042 and the N-channel transistor 7044.

Figure 8:
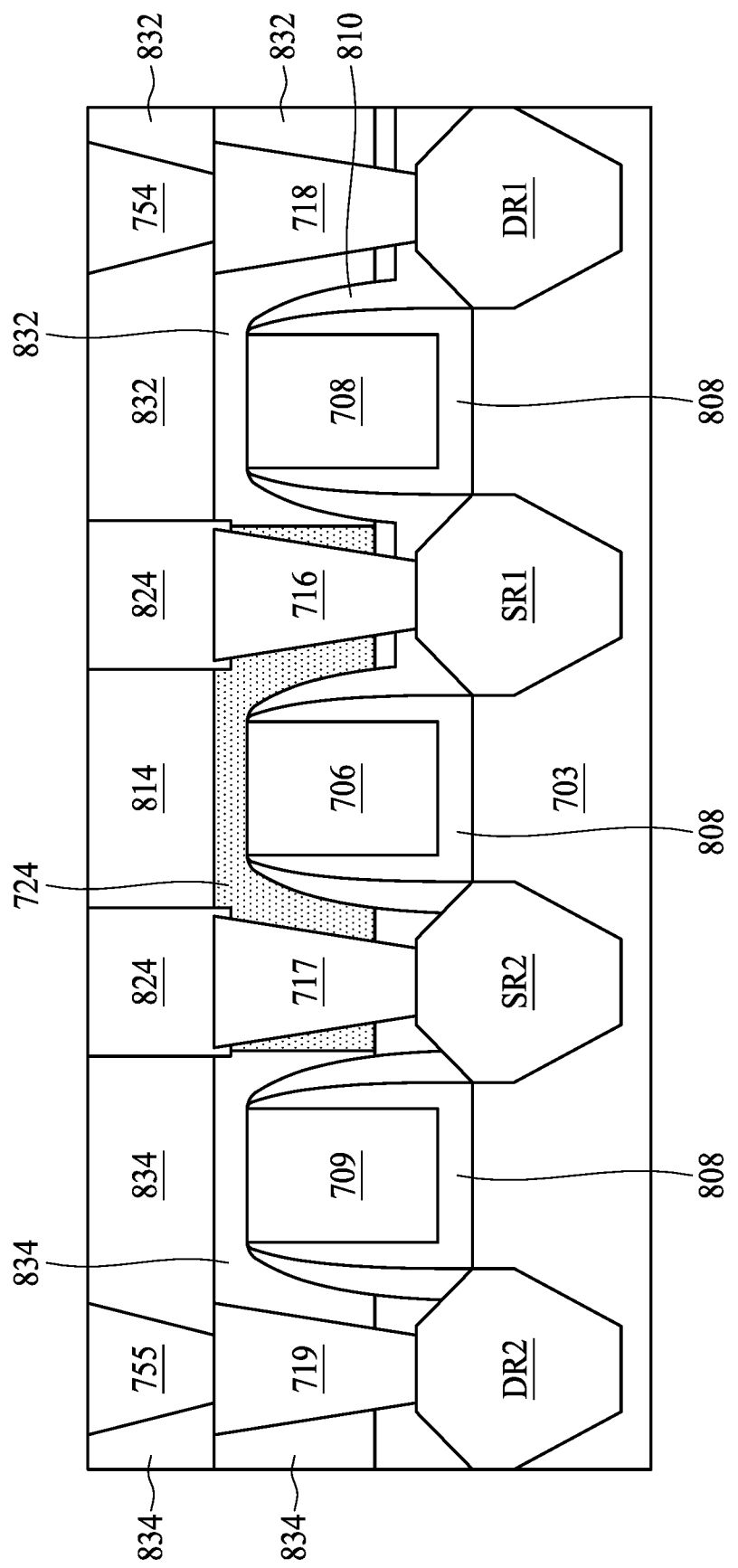
FIG. 8 is a sectional view taken along line of FIG. 7A in accordance with some embodiments.
Figure 9:
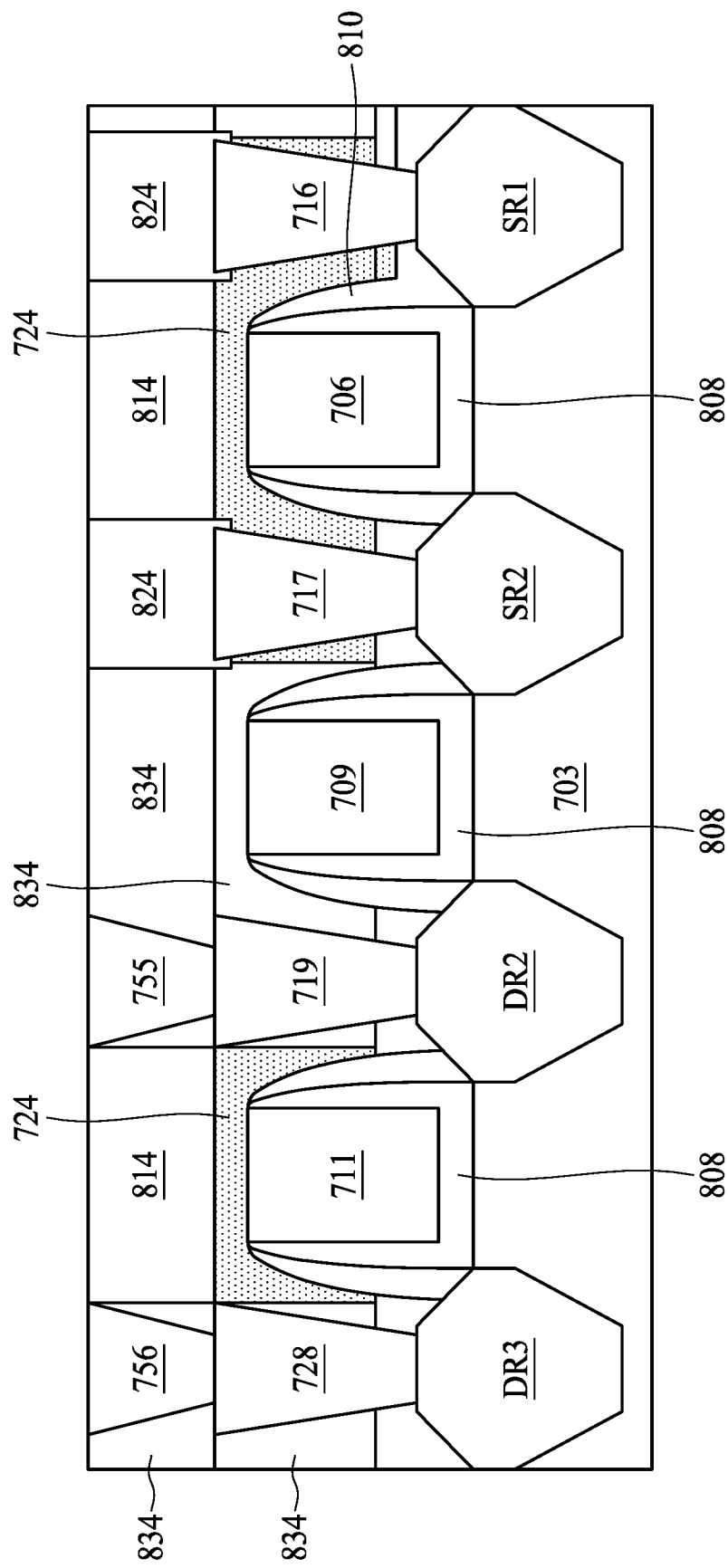
FIG. 9 is a sectional view taken along line of FIG. 7A in accordance with some embodiments.

To facilitate an understanding of the present disclosure, reference is next made to FIG. 8 and FIG. 9, which show sectional views taken along different lines of FIG. 7A in accordance with some embodiments. In the embodiments shown in FIG. 8 and FIG. 9, the P-channel transistors 7022 and 7042 shown in FIG. 7A can employ, but is not limited to, the structure shown in FIG. 4 for illustrative purposes. FIG. 8 is a sectional view taken along line B-B' of FIG. 7A in accordance with some embodiments. Referring to FIG. 8 and also to FIG. 7A, a conductive rail 824 can be formed on the first conductive rail 724, which is electrically connected to one end of the polysilicon line 706, one end of the metal line 716 and one end of the metal line 717. In the present embodiment, the first conductive rail 724 can be electrically connected to the supply voltage VDD through the conductive rail 824. In addition, an isolation region 832 is formed to separate the conductive rail 724 from the polysilicon line 708 and the metal line 718. An isolation region 834 is formed to separate the conductive rails 724 and 824 from the polysilicon line 709 and the metal line 719. The metal lines 716 and 717 are electrically connected to source regions SR1 and SR2 of the fin structure 703 respectively. The metal lines 718 and 719 are electrically connected to drain regions DR1 and DR2 of the fin structure 703 respectively. Moreover, an insulating layer 814 may formed on the polysilicon line 706 for isolating the polysilicon line 706 from being connected to a conductive via. Those skilled in the art should appreciate that the insulating layer 814 can be omitted without departing from the scope of the present disclosure.

As the polysilicon line 706, i.e. a bridge polysilicon line situated between the CMOS FinFET devices 702 and 704, is electrically connected to the supply voltage VDD via the first conductive rail 724, there is no need to dispose a conductive via on the top surface 1006 of the polysilicon line 920 for electrically connecting the polysilicon line 706 to the supply voltage VDD. As a result, the height of the semiconductor device 700 shown in FIG. 7A may be reduced as described in the above embodiments. In the present embodiment, each of the polysilicon lines 706, 708 and 709 are disconnected from the fin structure 703. A dielectric layer 808 is disposed between the fin structure 703 and each of the polysilicon lines 706, 708 and 709. Also, the dielectric layer 808 can be covered by an insulating layer 810.

FIG. 9 is a sectional view taken along line C-C' of FIG. 7A in accordance with some embodiments. Referring to FIG. 9 and also to FIG. 7A, the isolation region 834 is formed to separate the conductive rails 724 and 824 from the polysilicon line 711, the metal line 719 and the metal line 728. The metal line 728 is electrically connected to a drain region DR3 of the fin structure 703. The polysilicon line 711 is disconnected from the fin structure 703. In the present embodiment, the dielectric layer 808 is interposed between the polysilicon line 728 and the fin structure 703. Also, the insulating layer 1010 can be formed to separate the polysilicon line 728 from the drain regions DR2 and DR3. The insulating layer 814 may formed on the polysilicon line 711 for isolating the polysilicon line 711 from being connected to a conductive via.

With the use of the buried power rail structure, a miniaturized semiconductor device can have enough space for the routing resource on a predetermined metal layer such as the metal layer M0. For example, in the embodiment shown in FIG. 1C, at least four metal lines, i.e. the metal lines 142, 144, 146 and 148, are allowed to pass through the area between the metal lines 140 and 150 when the height H is relatively small. In addition, as a conductive via on a polysilicon line can be omitted, the semiconductor device utilizing the buried power rail structure may have better electromigration (EM) performance and higher gate density. For example, the gain of gate density may improve 15 to 25%.

Figure 10:
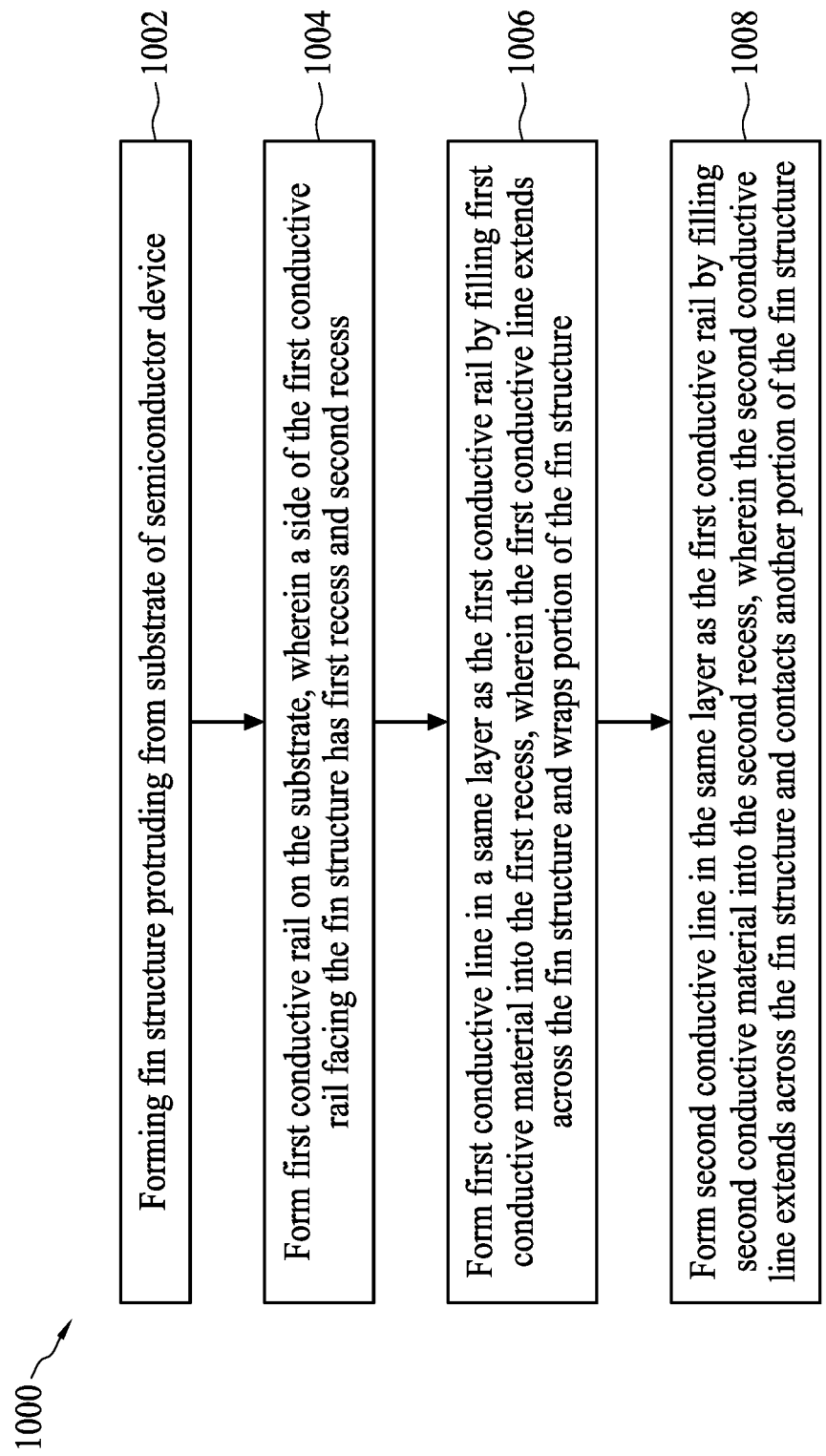
FIG. 10 is a flow chart of a method for forming a semiconductor device in accordance with some embodiments.

FIG. 10 is a flow chart of a method for forming a semiconductor device in accordance with some embodiments. For illustrative purposes, the method 1000 is described with reference to the semiconductor device 100 shown in FIG. 1A and the structure shown in FIG. 2. Those skilled in the art will recognize that the method 1000 can be employed in other types of semiconductor devices to provide a buried power rail structure without departing from the scope of the present disclosure. Additionally, in some embodiments, other operations in the method 1000 can be performed. In some other embodiments, operations of the method 1000 can be performed in a different order and/or vary.

At operation 1002, a fin structure is formed to protrude from a substrate of the semiconductor device. For example, the fin structure 103 is formed protrude from the substrate 101 of the semiconductor device 100.

At operation 1004, a first conductive rail is formed on the substrate. A side of the first conductive rail facing the fin structure has a first recess and a second recess. For example, the conductive rail 124 is formed on the substrate 101, wherein the first recess 202 and the second recess 204 are formed at a side of the conductive rail 124 facing the fin structure 103. As a result, the lateral surface 226 of the conductive rail 124 includes the first recess 202 and the second recess 204. In some embodiments, the conductive rail 124 may include materials such as tungsten, aluminum, copper, titanium, tantalum, titanium nitride, tantalum nitride, nickel silicide, cobalt silicide, other metallic materials, other proper conductive materials, and/or combinations thereof.

At operation 1006, a first conductive line is formed in a same layer as the first conductive rail by filling a first conductive material into the first recess. The first conductive line extends across the fin structure and wraps a portion of the fin structure. For example, the polysilicon line 106 is formed in a same layer as the conductive rail 124 by depositing a polysilicon material into the first recess 202. The polysilicon line 106 is arranged to extend across the fin structure 103 and wrap a portion of the fin structure 103.

At operation 1008, a second conductive line is formed in the same layer as the first conductive rail by filling a second conductive material into the second recess. The second conductive line extends across the fin structure and contacts another portion of the fin structure. For example, the metal line 116 is formed in the same layer as the conductive rail 124 by filling a metallic material into the second recess 204.

In some embodiments, a second conductive rail can be formed on the first conductive rail. The second conductive rail is electrically connected to a reference voltage such as a supply voltage or a ground voltage. For example, in the embodiment shown in FIG. 4, the conductive rail 424 coupled to the supply voltage VDD is formed on the conductive rail 124. As a result, the polysilicon line 106 can be electrically connected to the supply voltage VDD through the conductive rails 124 and 424. The conductive rail 124 can serve as a buried power rail.

With the use of the buried power rail structure, a polysilicon line can be electrically connected to a power supply line through a buried power rail and a metal line rather than a conductive via. Therefore, the landing issue of the conductive via can be alleviated, and the size of the FinFET device is also reduced.

According to some embodiments, a method for forming a semiconductor device is provided. The method includes: forming a fin structure protruding from a substrate of the semiconductor device; forming a first conductive rail on the substrate, wherein a side of the first conductive rail facing the fin structure has a first recess and a second recess; forming a first conductive line in a same layer as the first conductive rail by filling a first conductive material into the first recess, wherein the first conductive line extends across the fin structure and wraps a portion of the fin structure; and forming a second conductive line in the same layer as the first conductive rail by filling a second conductive material into the second recess, wherein the second conductive line extends across the fin structure and contacts another portion of the fin structure.

According to some embodiments, a method for forming a transistor structure is provided. The method includes: forming a fin structure protruding from a substrate; disposing a first conductive line, a second conductive line, a third conductive line and a fourth conductive line along a direction perpendicular to the fin structure to wrap a first predetermined region, a first source region, a gate region and a first drain region of the fin structure, respectively; and disposing a first conductive rail in a same layer as the first conductive line and one of the second conductive line and the fourth conductive line. The first conductive rail extends in a direction parallel to the fin structure to be laterally contacted by the first conductive line and the one of the second conductive line and the fourth conductive line.

According to some embodiments, a method for forming a semiconductor device is provided. The method includes: forming a fin structure protruding from a substrate of the semiconductor device; forming a first conductive line on the substrate along a first direction to wrap a first portion of the fin structure; forming a second conductive line on the substrate along the first direction to contact a second portion of the fin structure different from the first portion; disposing a first conductive rail along a second direction different from the first direction to be laterally contacted by one end of the first conductive line and a portion of one end of the second conductive line; and disposing a second conductive rail along the second direction to be laterally contacted by another portion of the one end of the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a fin structure protruding from a substrate of the semiconductor device;
    forming a first conductive rail on the substrate, wherein a side of the first conductive rail facing the fin structure has a first recess and a second recess;
    forming a first conductive line in a same layer as the first conductive rail by filling a first conductive material into the first recess, wherein the first conductive line extends across the fin structure and wraps a portion of the fin structure; and
    forming a second conductive line in the same layer as the first conductive rail by filling a second conductive material into the second recess, wherein the second conductive line extends across the fin structure and contacts another portion of the fin structure.

2. The method of claim 1, further comprising:
    forming a second conductive rail on the first conductive rail; and
    electrically connecting the second conductive rail to a reference voltage.

3. The method of claim 2, wherein a portion the first conductive line formed within the first recess is covered by the second conductive rail.

4. The method of claim 2, wherein a portion the second conductive line formed within the second recess is covered by the second conductive rail.

5. The method of claim 1, wherein the first conductive material is polysilicon, and the second conductive material is metal.

6. The method of claim 1, wherein the first conductive rail extends in a direction parallel to the fin structure.

7. The method of claim 1, further comprising:
    forming a third conductive line in the same layer as the first conductive rail, wherein the third conductive line extends across the fin structure to wrap a third portion of the fin structure different from the first portion and the second portion; and
    removing a portion of the third conductive line to disconnect the third conductive line from the first conductive rail.

8. The method of claim 7, wherein the third conductive line is formed between the first conductive line and the second conductive line.

9. The method of claim 7, further comprising:
    forming a conductive via on another portion of the third conductive line; and
    forming a second conductive rail on the first conductive rail, wherein the second conductive rail is disposed in a same layer as the conductive via while separated from the conductive via.

10. A method for forming a transistor structure, comprising:
    forming a fin structure protruding from a substrate;
    disposing a first conductive line, a second conductive line, a third conductive line and a fourth conductive line along a direction perpendicular to the fin structure to wrap a first predetermined region, a first source region, a gate region and a first drain region of the fin structure, respectively; and
    disposing a first conductive rail in a same layer as the first conductive line and one of the second conductive line and the fourth conductive line, wherein the first conductive rail extends in a direction parallel to the fin structure to be laterally contacted by the first conductive line and the one of the second conductive line and the fourth conductive line.

11. The method of claim 10, further comprising:
    removing a portion of another of the second conductive line and the fourth conductive line to disconnect the first conductive rail from the another of the second conductive line and the fourth conductive line.

12. The method of claim 10, further comprising:
    removing a portion of the third conductive line to disconnect the first conductive rail from the third conductive line.

13. The method of claim 10, further comprising:
    forming a second conductive rail on the first conductive rail in the direction parallel to the fin structure; and
    electrically connecting the second conductive rail to a reference voltage.

14. The method of claim 10, further comprising:
    forming a conductive via on the third conductive line; and
    forming a second conductive rail on the first conductive rail, wherein the second conductive rail is disposed in a same layer as the conductive via while separated from the conductive via.

15. The method of claim 10, further comprising:
    forming a conductive via on the one of the second conductive line and the fourth conductive line; and
    forming a second conductive rail on the first conductive rail, wherein the second conductive rail is disposed in a same layer as the conductive via while separated from the conductive via.

16. The method of claim 10, further comprising:
    disposing a fifth conductive line in the same layer as the first conductive rail to wrap a second predetermined region of the fin structure, wherein each of the second conductive line, the third conductive line and the fourth conductive line is disposed between the first conductive line and the fifth conductive line, and the first conductive rail is laterally contacted by the fifth conductive line.

17. A method for forming a semiconductor device, comprising:
    forming a fin structure protruding from a substrate of the semiconductor device;
    forming a first conductive line on the substrate along a first direction to wrap a first portion of the fin structure;
    forming a second conductive line on the substrate along the first direction to contact a second portion of the fin structure different from the first portion;
    disposing a first conductive rail along a second direction different from the first direction to be laterally contacted by one end of the first conductive line and a portion of one end of the second conductive line; and disposing a second conductive rail along the second direction to be laterally contacted by another portion of the one end of the second conductive line.

18. The method of claim 17, wherein the one end of the first conductive line and the another portion of the one end of the second conductive line are covered by the second conductive rail.

19. The method of claim 17, further comprising:

forming a third conductive line on the substrate along the first direction to contact a third portion of the fin structure different from the first portion and the second portion; and removing a portion of the third conductive line to disconnect the third conductive line from the first conductive rail.

20. The method of claim 19, further comprising:

forming a conductive via on the third conductive line, wherein the second conductive rail is disposed in a same layer as the conductive via while separated from the conductive via.

* * * * *